US008148180B2

(12) United States Patent
Felker et al.

(10) Patent No.: US 8,148,180 B2
(45) Date of Patent: Apr. 3, 2012

(54) TECHNIQUES OF FORMING OHMIC CONTACTS ON GAN LIGHT EMITTING DIODES

(75) Inventors: Andrew J. Felker, Livermore, CA (US); Nicholas Andrew Vickers, Hayward, CA (US)

(73) Assignee: Sorra, Inc., Fremont, CA (US)

( * ) Notice: Subject to any disclaimer, the term of this patent is extended or adjusted under 35 U.S.C. 154(b) by 0 days.

(21) Appl. No.: 13/184,160

(22) Filed: Jul. 15, 2011

(65) Prior Publication Data

US 2012/0009705 A1     Jan. 12, 2012

(51) Int. Cl.
*H01L 21/00* (2006.01)
(52) U.S. Cl. ........... 438/22; 438/29; 257/90; 257/98; 257/E31.047; 136/258
(58) Field of Classification Search ........... 438/22, 438/29; 257/98–99, E33.074, E31.047; 136/258
See application file for complete search history.

(56) References Cited

U.S. PATENT DOCUMENTS 7,897,988 B2 *  3/2011  Chen et al. .................. 257/98

* cited by examiner

*Primary Examiner* — Fernando L Toledo
*Assistant Examiner* — Mark A Laurenzi
(74) *Attorney, Agent, or Firm* — Kilpatrick Townsend & Stockton LLP

(57) ABSTRACT

A method of forming ohmic contacts on a light emitting diode that features a surface treatment of a substrate includes exposing a surface of a p-type gallium nitride layer to an acid-containing solution and a buffered oxide etch process. A quantum well is formed in a gallium nitride substrate and a layer of p-type gallium nitride is deposited over the quantum well. The surface of the p-type gallium nitride is exposed to an acid-containing solution and then a buffered oxide etch process is performed to provide an etched surface. A metal stack including a layer of silver disposed between layers of platinum is then deposited.

20 Claims, 6 Drawing Sheets

TECHNIQUES OF FORMING OHMIC CONTACTS ON GAN LIGHT EMITTING DIODES

BACKGROUND OF THE INVENTION

The invention is directed to light emitting diodes and in particular to ohmic contacts for light emitting diodes.

One technique for measuring the efficiency of light emitting diodes (LEDs) is by determining the luminance per watt. The luminance provided by light emitting diodes is dependent upon several factors such as internal quantum efficiencies, as in the case of an injected carrier not being converted to a photon, or extraction efficiency, as in the case of a small fraction of photons being successfully extracted from the light emitting diode as opposed to being lost to internal absorption. To realize high efficiency LEDS, both of these issues need to be addressed. The potential gain from improving extraction efficiency, however, is likely to be greater and simpler to accomplish than the gains from improving internal efficiency.

One technique to improve light extraction of visible light nitride LEDs, such as Gallium Nitride (GaN) LEDs, is achieved through use of high reflectivity metallurgies which are typically mounted to one side of the LED. GaN based devices typically require ohmic contact formation as a means of establishing electrical contact to the device with minimal impact on the operating voltage of the device. Thus, the high reflectivity metallurgies are typically employed in the ohmic contact and attached to a p-type GaN layer of the LED. One common approach is to use a silver containing layer in the ohmic contact. Silver is desirable, because of its high reflectance. The difference in the work function between silver and the other materials from which the LED is fabricated has been problematic. For example, it is widely accepted that metals with high work functions form the best contacts for p-type semiconductor materials, while metals with low work functions form the best contacts for n-type semiconductor materials. However, surface contamination of the metal semiconductor interface may degrade the ohmic contact performance of metals. Contamination layers at the interface may produce an unforeseen electronic state that may degrade the efficiency of the LED.

There is a need, therefore, to provide improve ohmic contact techniques for LEDs.

BRIEF SUMMARY OF THE INVENTION

This invention is directed to a method of forming ohmic contacts on a light emitting diode that features a surface treatment of a substrate that includes exposing a surface of a layer p-type gallium nitride to an acid-containing solution and a buffered oxide etch process. To that end, the method includes forming a quantum well in a gallium nitride substrate, depositing a layer of p-type gallium nitride upon said quantum wells, exposing a surface of said p-type gallium nitride to an acid-containing solution, forming a cleaned surface; subjecting said cleaned surface to a buffered oxide etch process, forming an etched surface; and generating, upon said etched surface, a metal stack including a layer of silver disposed between layers of platinum. These and other embodiments are discussed further below.

DETAILED DESCRIPTION OF THE INVENTION

Figure 1:
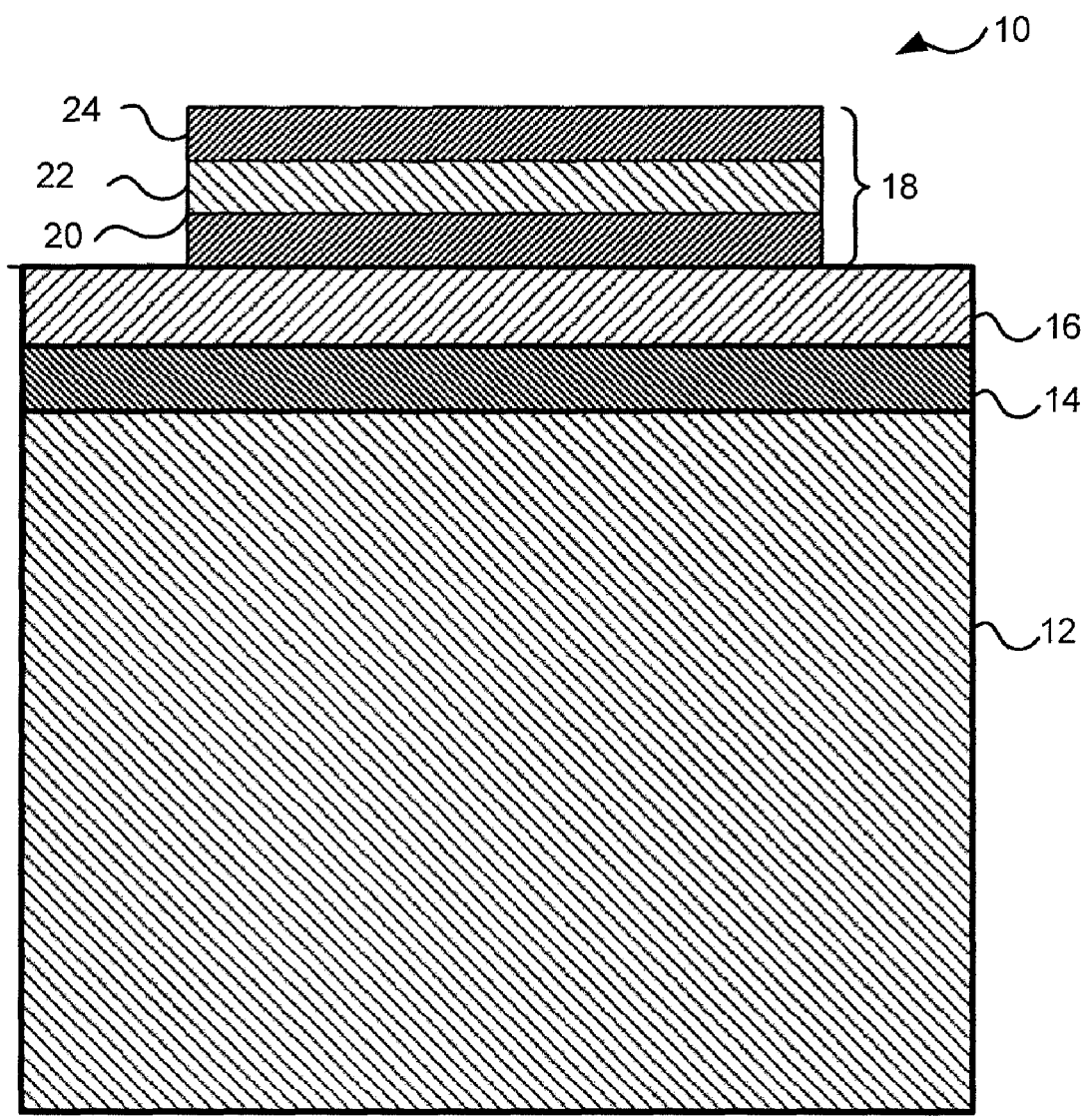
FIG. 1 is a cross-sectional view of a single light emitting diode manufactured in accordance with the present invention.

Referring to FIG. 1, shown is a light emitting diode 10 manufactured in accordance with the present invention that includes a substrate 12 formed of n-type galliumnitride GaN. An active layer 14 is formed upon substrate. Active layer 14 may comprise a single quantum well or multiple quantum wells, with 2-10 quantum wells. A layer of p-type gallium nitride 16 is formed upon quantum wells 14. A metal stack 18 is positioned upon layer 16 and is comprised of three separate metal layers, shown as 20, 22 and 24. Layers 20 and 24 are formed from platinum and layer 22 is formed from silver.

Substrate 12 may have a large-surface orientation within ten degrees, within five degrees, within two degrees, within one degree, within 0.5 degree, or within 0.2 degree of (0 0 0 1), (0 0 0 –1), {1–1 0 0}, {1 1–2 0}, {1–1 0.+–0.1}, {1–1 0.+–0.2}, {1–1 0.+–0.3}, {2 0–2.+–0.1}, or {1 1–2.+–0.2}. In one specific embodiment, the substrate has a semipolar large-surface orientation, which may be designated by (hkil) Bravais-Miller indices, where i=–(h+k), l is nonzero and at least one of h and k are nonzero. The substrate may have a dislocation density below 10.sup.4 cm.sup.-2, below $10^3$ $cm^{-2}$, or below $10^2$ $cm^{-2}$. Substrate 12 may have an optical absorption coefficient below 100 cm $10^{-1}$, below 50 $cm^{-1}$ or below 5 $cm^{-1}$ at wavelengths between about 465 nm and about 700 nm. The nitride base crystal may have an optical absorption coefficient below 100 $cm^{-1}$, below 50 $cm^{-1}$ or below 5 $cm^{-1}$ at wavelengths between about 700 nm and about 3077 nm and at wavelengths between about 3333 nm and about 6667 nm. The surface of substrate 12 may have a dislocation density below $10^5$ $cm^{-2}$ and is substantially free of low-angle grain boundaries, or tilt boundaries, over a length scale of at least 3 millimeters. Substrate 12 may be doped with any suitable n-type dopants from group VI and group IV atoms, e.g., sulfur, selenium, tellurium, silicon, germanium. In the present embodiment, substrate 12 is doped with Si and O to dope our GaN, providing a dopant concentration of approximately of 3 E18 cm-3.

Active layer 14 may comprise of InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where w<u, y and/or x>v, z so that the bandgap of the well layer(s) is less than that of the barrier layer(s) and the n-type substrate. The well layers and barrier layers may each have a thickness between about 1 nm and about 20 nm. In another embodiment, active layer 14 comprises a double heterostructure, with an InGaN or $Al_wIn_xGa_{1-w-x}N$ and $Al_yIn_zGa_{1-y-z}N$ layer about 20 nm to about 500 nm thick surrounded by GaN or Al$_y$In$_z$Ga$_{1-y-z}$N layers, where w<u, y and/or x>v, z. The composition and structure of the active layer are chosen to provide light emission at a preselected wavelength. Active layer 14 may be left undoped (or unintentionally doped) or may be doped n-type or p-type. Active layer 14 is formed upon substrate 12 using standard processing techniques.

Layer 16 may be doped with any suitable p-type dopant, such as those from group II or IV atoms, e.g., magnesium, zinc, cadmium, silicon, germanium. In the present example, layer is doped with magnesium to provide a dopant concentration of approximately 1e20 cm$^{-3}$.

Figure 2:
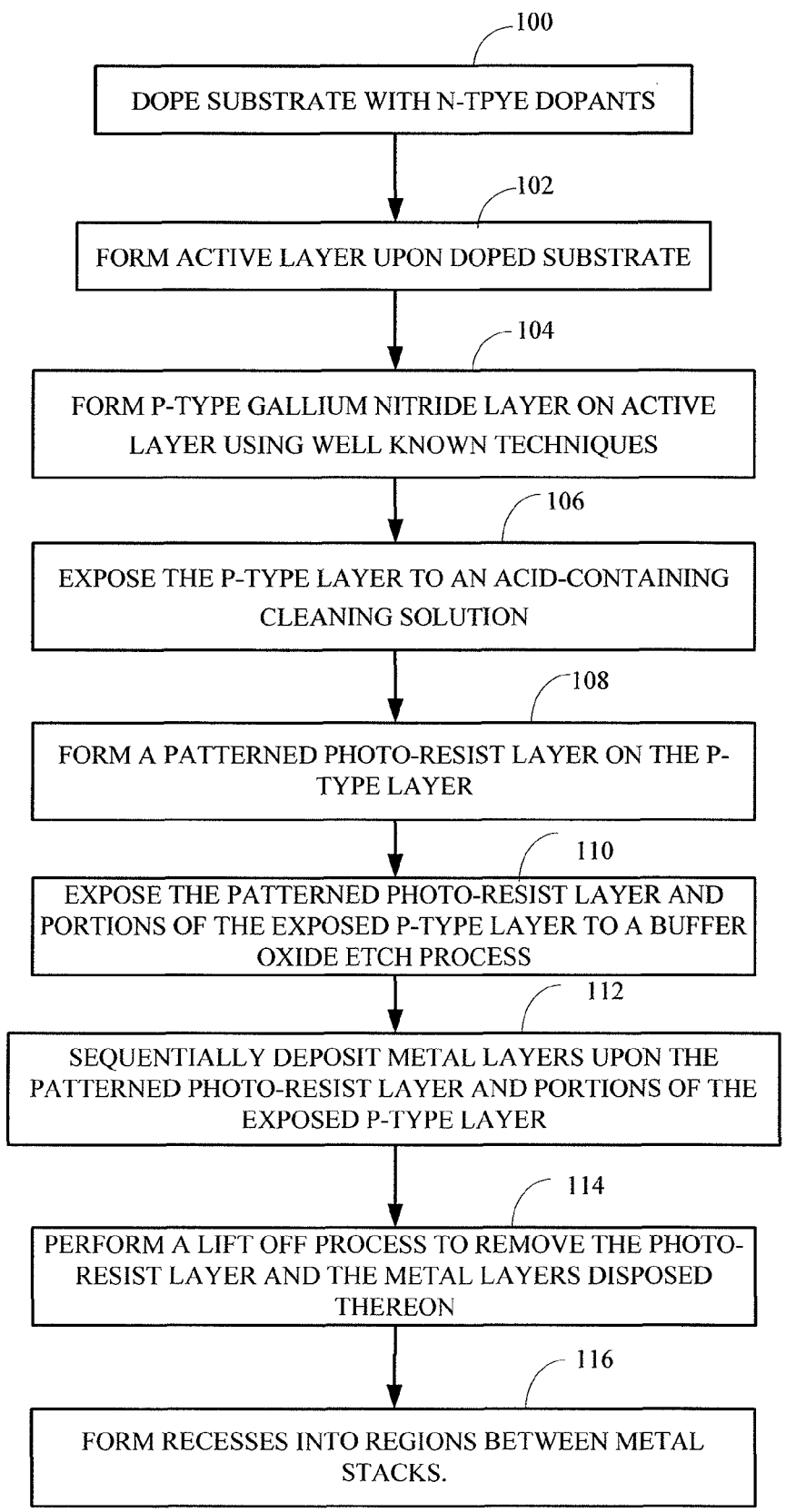
FIG. 2 is a flow diagram showing the steps used to manufacture the light emitting diode shown in FIG. 1.
Figure 3:
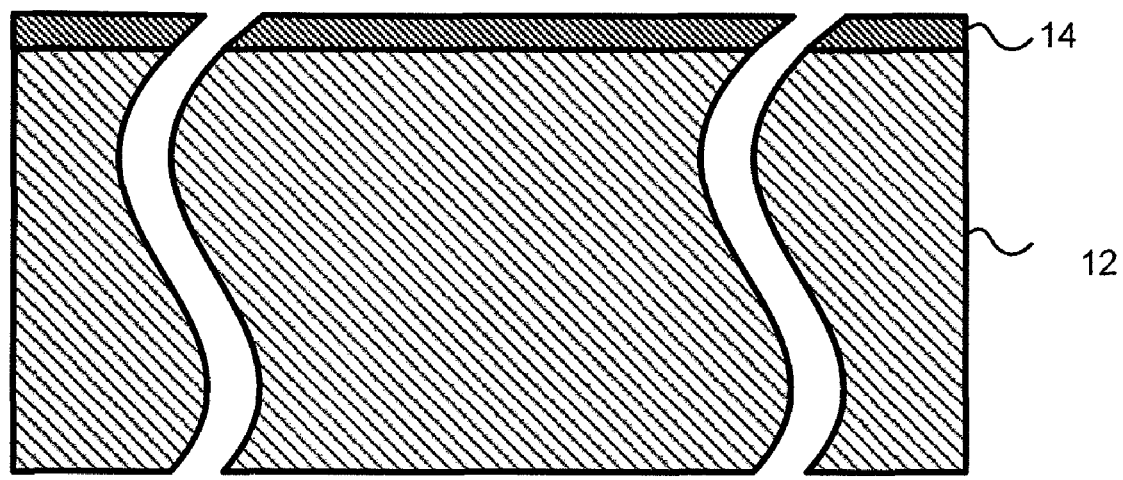
FIG. 3 is a cross-sectional view showing a substrate upon which the light emitting diode shown in FIG. 1 is produced.
Figure 4:
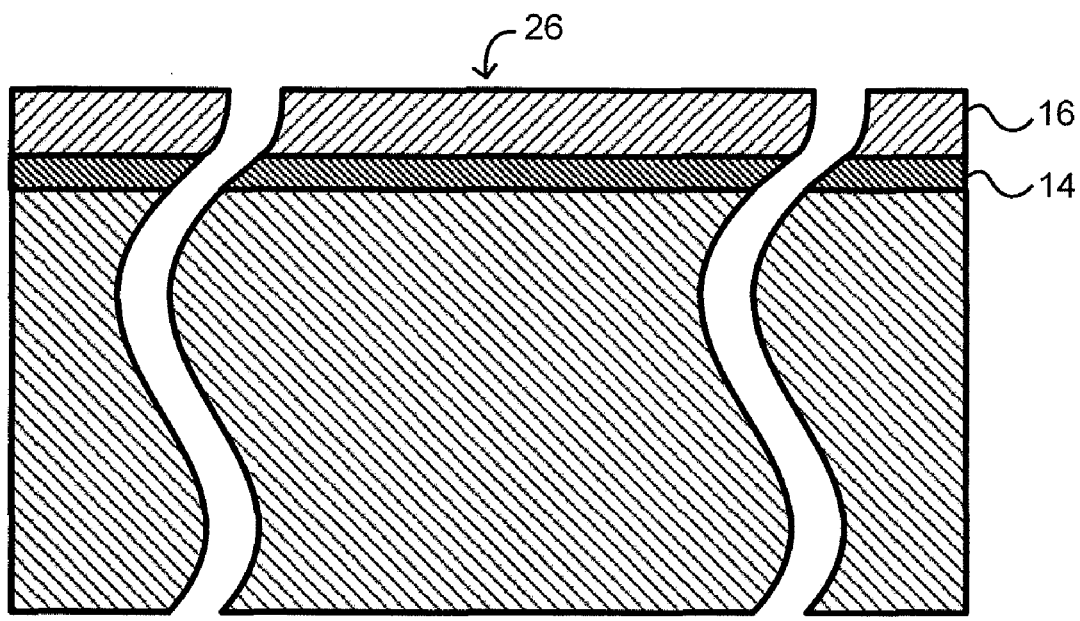
FIG. 4 is a cross-sectional view showing the substrate in FIG. 3 with a p-type gallium arsenide layer disposed thereon.

Referring to FIGS. 2 and 3, substrate 12 is doped with n-type dopants using well known techniques, at step 100. At step 102, active layer 14 is formed upon substrate 12 using well known techniques. Following formation of active layer 14, p-type gallium nitride layer 16 is formed thereupon, shown in FIG. 4, at step 104 of FIG. 2. At step 106 surface of layer is exposed to an acid-containing cleaning solution. The cleaning solution consists essentially of 15% of nitric acid by weight, 27% of hydrochloric acid by weight and 58% of water by weight. This provides cleaned surface 26.

Figure 5:
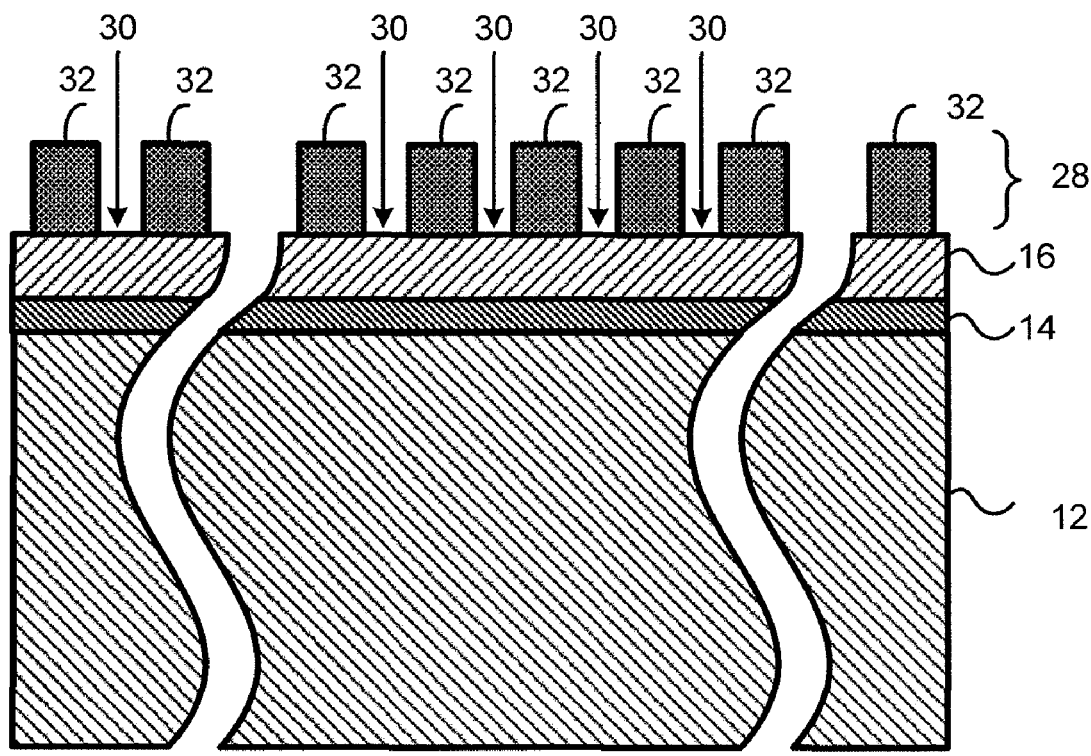
FIG. 5 is a simplified cross-sectional view of the substrate shown in FIG. 4 having a patterned photo resist layer deposited thereon.
Figure 6:
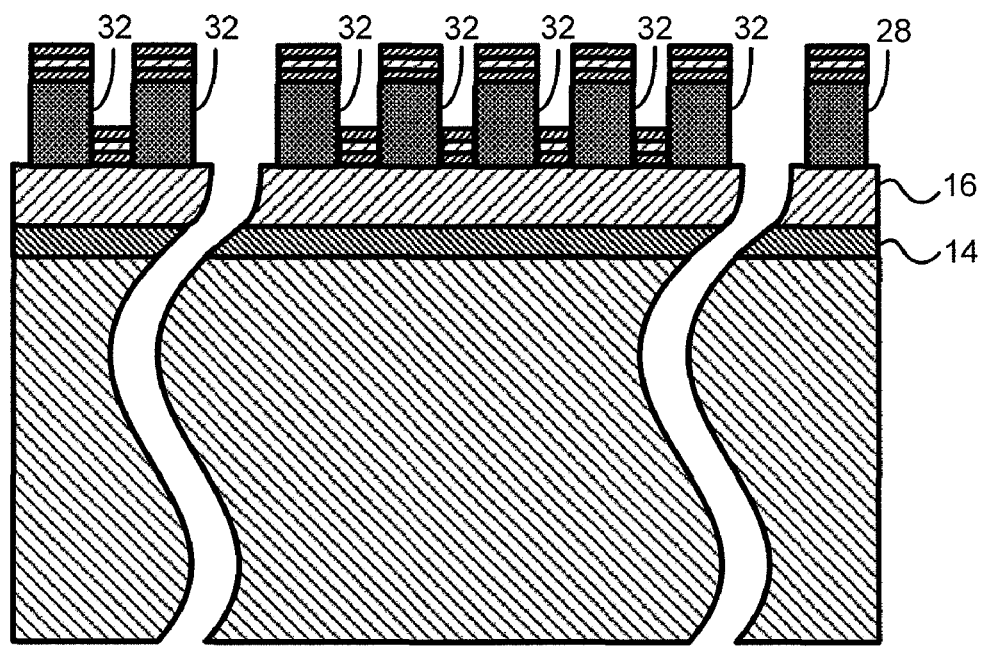
FIG. 6 is a simplified cross-sectional view of the substrate shown in FIG. 4 having a plurality of metal layers deposited thereupon.

Referring to both FIG. 2 and FIG. 5, at step 108 a patterned photo resist layer 28 is formed upon cleaned surface 26. Layer 28 has a shape of a battlement leaving portions 30 of cleaned surface 26, with segments 32 of photo resist material being present between adjacent portions 30. Following formation of patterned photo resist layer 28, substrate 12 regions 30 and segments 32 are exposed to a buffered oxide etch process, at step 110. To that end, substrate 12 dipped into a solution consisting essentially of 2% hydrofluoric acid by weight and 8.75% ammonium fluoride by weight, with the rest being water. At step 112, three metal layers are sequentially deposited upon portions and segments 32. Specifically, a platinum layer 34 is deposited, followed by deposition of a silver layer 36. Another platinum layer 38 is deposited upon silver layer 36.

Figure 7:
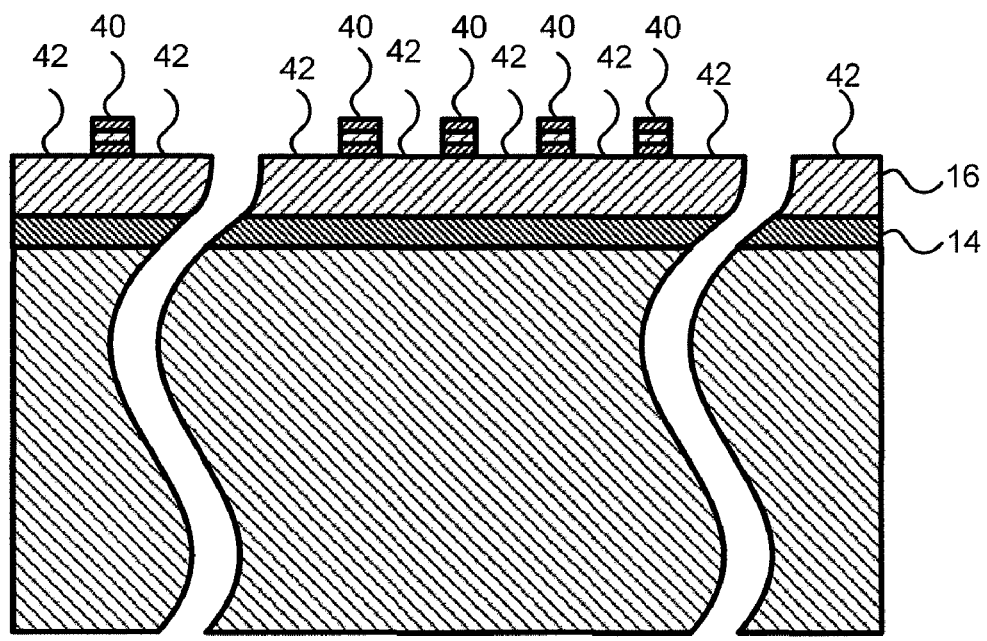
FIG. 7 is a cross-section view of the substrate shown in FIG. 6 after being subjected to a lift-off process that removed the photo resist.

Referring to FIG. 2, at step 114 a lift-off process is undertaken to remove segments 38 and the portions of layers 34, 36 and 38 in superimposition therewith, leaving a plurality of spaced-apart metal stacks 40. As a result, regions 42, shown in FIG. 7, of exposed substrate 12 remain between adjacent metal stacks 40.

Figure 8:
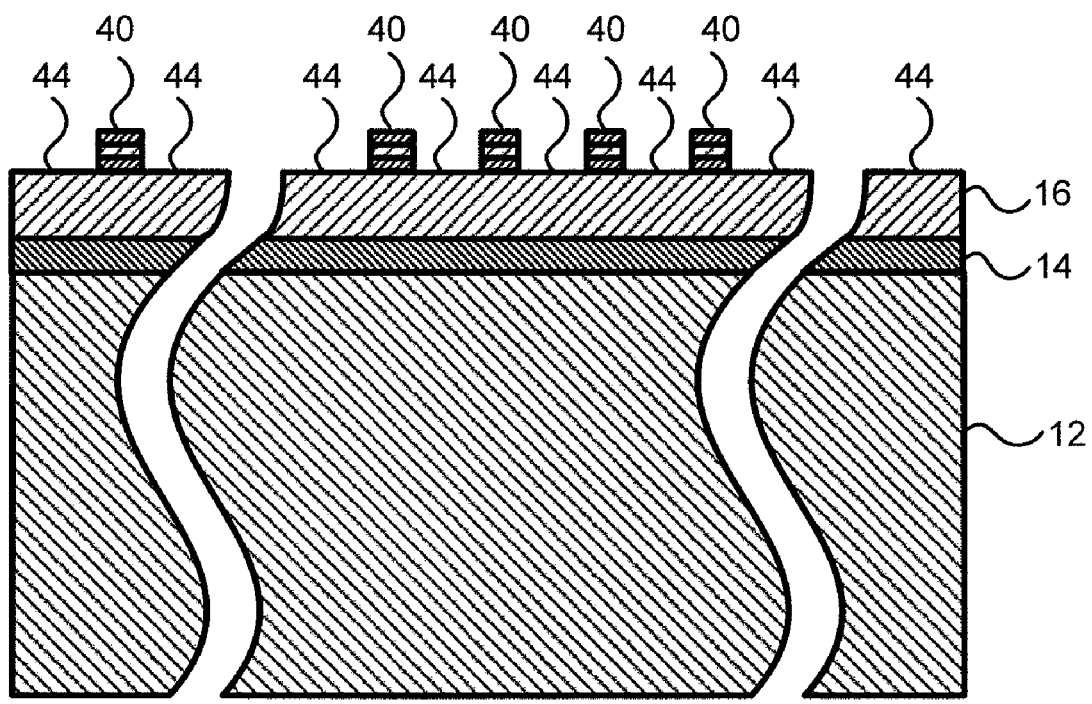
FIG. 8 is a simplified cross-sectional view of the substrate shown in FIG. 6, scored-regions formed thereon.

Referring to both FIGS. 2 and 8, at step 116, a recess 44 is formed in regions 42, using desired techniques, such as laser etching. Recesses 44 compromise the structural integrity of substrate 42 so that the same may be segmented to produce light emitted diode 10, shown in FIG. 1.

It should be understood that the description recited above is an example of the invention and that modifications and changes to the examples may be undertaken which are within the scope of the claimed invention. Therefore, the scope of the appended claims should be accorded the broadest interpretation so as to encompass all such modifications and similar arrangements, including a full scope of equivalents.

What is claimed is:

1. A method of forming ohmic contacts on a light emitting diode comprising:
    forming an active layer on a gallium nitride substrate;
    depositing a layer of p-type gallium nitride upon the active layer;
    exposing a surface of said p-type gallium nitride to an acid-containing solution, forming a cleaned surface;
    subjecting the cleaned surface to a buffered oxide etch process, forming an etched surface; and
    generating, upon the etched surface, a metal stack including a layer of silver.

2. The method as recited in claim 1 wherein exposing further includes providing nitric acid, hydrochloric acid and water in said acid-containing solution.

3. The method as recited in claim 1 wherein exposing further includes providing nitric acid, hydrochloric acid and water in said acid containing solution, with said acid-containing solution consisting essentially of 15% of said nitric acid by weight, 27% of said hydrochloric acid by weight and 58% of said water by weight.

4. The method as recited in claim 1 wherein subjecting further includes providing said buffer oxide etch process with components consisting essentially of 2% hydrofluoric acid by weight and 8.75% ammonium fluoride by weight.

5. The method as recited in claim 1 wherein generating further includes depositing said layer of silver between two layers of platinum.

6. The method as recited in claim 1 further including producing a patterned photo resist on said surface followed by deposition of said metal stack.

7. The method as recited in claim 1 further including producing a patterned photo resist by covering a sub-portion of said cleaned surface with remaining regions of said cleaned surface being exposed followed by exposing said surface to said buffered oxide etch process.

8. The method as recited in claim 1 further including producing a patterned photo resist on said surface followed by depositing said metal stack on said patterned photo resist following exposing said cleaned surface to said buffered oxide etch process.

9. The method as recited in claim 1 further including producing a patterned photo resist on said surface following deposition of said metal stack on said patterned photo resist followed by exposing said surface to said buffered oxide etch process and lifting-off said photo-resist to produce a plurality of spaced-apart metal stacks upon said substrate.

10. The method as recited in claim 1 wherein depositing further includes providing said layer with a p-type dopant concentration of 1e20 cm$^{-3}$.

11. A method of forming ohmic contacts on a light emitting diode, said method comprising:
    forming a plurality of quantum wells on a gallium nitride substrate;
    depositing a layer of p-type gallium nitride upon said quantum wells;
    exposing a surface of said p-type gallium nitride to an acid-containing solution, forming a cleaned surface;
    producing a patterned photo resist on said cleaned surface covering sub-portions thereof with remaining regions being exposed;
    subjecting said remaining regions to a buffered oxide etch process, forming etched regions;
    generating a metal stack on said etched regions;
    lifting-off said photo-resist to produce a plurality of spaced-apart metal stacks upon said substrate; and
    segmenting said substrate into a plurality of discrete segments, each of which includes one of said plurality of metal stacks.

12. The method as recited in claim 11 wherein depositing further includes providing said layer with a p-type dopant concentration of 1e20 cm$^{-3}$.

13. The method as recited in claim 11 wherein exposing further includes providing nitric acid, hydrochloric acid and water in said acid-containing solution.

14. The method as recited in claim 11 wherein exposing further includes providing nitric acid, hydrochloric acid and water in said acid containing solution, with said acid-containing solution consisting essentially of 15% of said nitric acid by weight, 27% of said hydrochloric acid by weight and 58% of said water by weight.

15. The method as recited in claim 11 wherein subjecting further includes providing said buffer oxide etch process with components consisting essentially of 2% hydrofluoric acid by weight and 8.75% ammonium fluoride by weight.

16. The method as recited in claim 11 wherein generating further includes depositing a layer of silver between two layers of platinum.

17. A method of forming ohmic contacts on a light emitting diode, said method comprising:
 forming a plurality of quantum wells on a gallium nitride substrate;
 depositing a layer of gallium nitride upon said quantum wells with a p-type dopant at a concentration of 1e20 $cm^{-3}$;
 exposing a surface of said p-type gallium nitride to an acid-containing solution, consisting essentially of nitric acid, hydrochloric acid and water, forming a cleaned surface;
 producing a patterned photo resist on said cleaned surface exposing portions thereof;
 subjecting said portions to a buffered oxide etch process, forming etched regions;
 depositing a metal stack on said etched regions;
 lifting-off said photo-resist to produce a plurality of spaced-apart metal stacks upon said substrate; and
 segmenting said substrate into a plurality of discrete segments, each of which includes one of said plurality of metal stacks.

18. The method as recited in claim 17 wherein exposing further includes providing said acid-containing solution with 15% of said nitric acid by weight, 27% of said hydrochloric acid by weight and 58% of said water by weight.

19. The method as recited in claim 17 wherein subjecting further includes providing said buffer oxide etch process with components consisting essentially of 2% hydrofluoric acid by weight and 8.75% ammonium fluoride by weight.

20. The method as recited in claim 17 wherein generating further includes depositing a layer of silver between two layers of platinum.

\* \* \* \* \*